(12) United States Patent
Gu et al.

(10) Patent No.: US 11,480,594 B2
(45) Date of Patent: Oct. 25, 2022

(54) SYSTEMS AND METHODS OF BAD DATA IDENTIFICATION AND RECOVERY FOR ELECTRIC POWER SYSTEMS

(71) Applicants: Global Energy Interconnection Research Institute Co. Ltd, Beijing (CN); State Grid Corporation of China Co. Ltd, Beijing (CN); State Grid Jiangsu Electric Power Co., LTD., Jiangsu (CN); State Grid ShanXi Electric Power Company, Shandong (CN)

(72) Inventors: Yingzhong Gu, San Jose, CA (US); Guanyu Tian, San Jose, CA (US); Chunlei Xu, San Jose, CA (US); Haiwei Wu, San Jose, CA (US); Zhe Yu, San Jose, CA (US); Di Shi, San Jose, CA (US)

(73) Assignees: Global Energy Interconnection Research Institute Co. Ltd, Beijing (CN); State Grid Corporation of China Co. Ltd, Beijing (CN); State Grid Jiangsu Electric Power Co., Ltd., Jiangsu (CN); State Grid Shanxi Electric Power Company, Shyandong (CN)

( * ) Notice: Subject to any disclaimer, the term of this patent is extended or adjusted under 35 U.S.C. 154(b) by 64 days.

(21) Appl. No.: 17/091,792

(22) Filed: Nov. 6, 2020

(65) Prior Publication Data
US 2021/0141007 A1 May 13, 2021

Related U.S. Application Data

(60) Provisional application No. 62/932,184, filed on Nov. 7, 2019.

(51) Int. Cl.
*G01R 21/133* (2006.01)
*G06F 17/16* (2006.01)
(Continued)

(52) U.S. Cl.
CPC .......... *G01R 21/133* (2013.01); *G06F 17/16* (2013.01); *G06K 9/6289* (2013.01); *G06N 3/08* (2013.01)

(58) Field of Classification Search
CPC ... G01R 21/133; G01R 19/2513; G06F 17/16; G06K 9/6289; G06K 9/0051;
(Continued)

(56) References Cited

U.S. PATENT DOCUMENTS 9,941,959 B2  4/2018  Heath et al.
10,074,038 B2  9/2018  Hsieh et al.
(Continued)

FOREIGN PATENT DOCUMENTS

KR    101836096 B1    3/2018

OTHER PUBLICATIONS

Saeed et al.Mitigating the Impacts of Covert Cyber Attacks in Smart Grids Via Reconstruction of Measurement Data Utilizing Deep Denoising Autoencoders, Energies (Year: 2019).*

(Continued)

*Primary Examiner* — Mohammad K Islam
(74) *Attorney, Agent, or Firm* — Greenberg Traurig, LLP; David J. Dykeman; Peigen Jiang

(57) ABSTRACT

Systems and methods for processing measurement data in an electric power system include acquiring the measurement data by a phasor measurement unit (PMU) coupled to a line of the electric power system, and inputting a plurality of the measurement data within a predetermined time window into a K-nearest neighbor (KNN) for identifying bad data among the plurality of the measurement data, wherein when one of
(Continued)

the plurality of measurement data contains a bad datum, the machine learning module sends the bad datum to a denoising autoencoder module for correcting the bad datum, wherein the denoising autoencoder module outputs a corrected part corresponding to the bad datum, and when one of the plurality of measurement data contains no bad datum, the machine learning module bypasses the denoising autoencoder module and outputs the one of the plurality of measurement data as an untouched part.

16 Claims, 13 Drawing Sheets

(51) Int. Cl.
G06K 9/62 (2022.01)
G06N 3/08 (2006.01)

(58) Field of Classification Search
CPC .... G06K 9/00536; G06K 9/6276; G06N 3/08; G06N 3/0454; G06N 20/00; G06N 3/0472; G06N 3/088; G06V 10/98; Y02E 40/70; Y02E 60/00; Y04S 10/22
See application file for complete search history.

(56) References Cited

U.S. PATENT DOCUMENTS

| | | | |
|---|---|---|---|
| 10,628,943 B2 | 4/2020 | Hsieh et al. | |
| 2015/0089399 A1 | 3/2015 | Megill et al. | |
| 2019/0006847 A1* | 1/2019 | Venkatasubramanian | H02J 13/00006 |
| 2020/0293032 A1* | 9/2020 | Wang | G06N 3/0445 |
| 2020/0387797 A1* | 12/2020 | Ryan | G06F 11/3447 |

OTHER PUBLICATIONS

Lin et al. ,Reconstruction of Power System Measurements Based on Enhanced Denoising Autoencoder (Year: 2018).*
Vladimiro et al. , Deep Learning Applied to PMU Data in Power Systems (Year: 2017).*
Ree et al. ,Synchronized Phasor Measurement Applications in Power Systems (Year: 2010).*
Ali Abur, "A bad data identification method for linear programming state estimation", IEEE Transactions on Power Systems, 5(3):894-901, 1990.
Bagheri et al., "Application of data mining and feature extraction on intelligent fault diagnosis by artificial neural network and k-nearest neighbor" In The XIX International Conference on Electrical Machines-ICEM 2010, pp. 1-7. IEEE, 2010.
California-ISO. Five year synchrophasor plan. https://www.caiso.com/Documents/FiveYearSynchrophasorPlan.pdf. Last accessed Sep. 18, 2019.
Per-Erik Danielsson, "Euclidean distance mapping", Computer Graphics and image processing, 14(3):227-248, 1980.
Deng et al. "Deep learning: methods and applications", Foundations and Trends in Signal Processing, 7(3-4):197-387, 2014.
Deng et al. "Impact of low data quality on disturbance triangulation application using high-density pmu measurements", IEEE Access, 7:105054-105061, 2019.
Goodfellow et al., Deep Learning. MIT Press, 2016. http://www.deeplearningbook.org.
Jovicic et al., "Linear state estimation and bad data detection for power systems with rtu and pmu measurements" 01 2020.
Keller et al., "A fuzzy k-nearest neighbor algorithm", IEEE transactions on systems, man, and cybernetics, (4):580-585, 1985.
Liao et al., "An alternating direction method of multipliers based approach for pmu data recovery", IEEE Transactions on Smart Grid, 10(4):4554-4565, 2018.
Liao et al., "Estimate the lost phasor measurement unit data using alternating direction multipliers method", In 2018 IEEE/PES Transmission and Distribution Conference and Exposition (T&D), pp. 1-9 IEEE, 2018.
Lin et al., "Reconstruction of power system measurements based on enhanced denoising autoencoder" arXiv preprint arXiv: 1907 11738, 2019.
Li, "A method of bad data identification based on wavelet analysis in power system", In 2012 IEEE International Conference on Computer Science and Automation Engineering (CSAE), vol. 3, pp. 146-150. IEEE, 2012.
A. Monticelli, "Electric power system state estimation", Proceedings of the IEEE, 88(2):262-282, 2000.
Mousavi et al., "A deep learning approach to structured signal recovery", In 2015 53rd annual allerton conference on communication, control, and computing (Allerton), pp. 1336-1343. IEEE, 2015.
Pal et al., "Classification and detection of pmu data manipulation attacks using transmission line parameters", IEEE Transactions on Smart Grid, 9(5):5057-5066,2018.
Robert H. Park, "Two-reaction theory of synchronous machines generalized method of analysis-part I", Transactions of the American Institute of Electrical Engineers, 48(3):716-727, 1929.
Phadke et al., "Recent developments in state estimation with phasor measurements", In 2009 IEEE/PES Power Systems Conference and Exposition, pp. 1-7. IEEE, 2009.
Phadke et al., "Communication needs for wide area measurement applications", In 2010 5th International Conference on Critical Infrastructure (CRIS), pp. 1-7. IEEE, 2010.
Pignati et al., "A pre-estimation filtering process of bad data for linear power systems state estimators using pmus", In 2014 Power Systems Computation Conference, pp. 1-8, 2014.
Scholz et al., "Nonlinear pca: a new hierarchical approach", In Esann, pp. 439-444, 2002.
Shi et al., "An adaptive method for detection and correction of errors in pmu measurements", IEEE Transactions on Smart Grid, 3(4):1575-1583, 2012.
Tian et al., "A hybrid-learning algorithm for online dynamic state estimation in multimachine power systems", IEEE Transactions on Neural Networks and Learning Systems, 2020.
Vanfretti et al., "A phasor-data-based state estimator incorporating phase bias correction", IEEE Transactions on Power Systems, 26(1):111-119, 2011.
Vincent et al., "Extracting and composing robust features with denoising autoencoders", In Proceedings of the 25th international conference on Machine learning, pp. 1096-1103, 2008.
Wang et al.,"Online identification and data recovery for pmu data manipulation attack", IEEE Transactions on Smart Grid, 10(6):5889-5898, 2019.
Wang et al., "Online calibration of phasor measurement unit using density-based spatial clustering", IEEE Transactions on Power Delivery, 33(3): 1081-1090, 2018.
Wan et al., "Wrong data identification and correction for wams", In 2016 IEEE PES Asia-Pacific Power and Energy Engineering Conference (APPEEC), pp. 1903-1907 IEEE, 2016.
Weinberger et al., "Distance metric learning for large margin nearest neighbor classification", In Advances in neural information processing systems, pp. 1473-1480, 2006.
Xie et al.,"Comparison of ring-down response estimation between rdt and next under ambient condition", In 2018 IEEE Power & Energy Society General Meeting (PESGM), pp. 1-5. IEEE, 2018.
Zhang et al., "A linear recursive bad data identification method with real-time application to power system state estimation", IEEE transactions on power systems, 7(3):1378-1385, 1992.
Zhang et al., "Design, testing, and implementation of a linear state estimator in a real power system", IEEE Transactions on Smart Grid, 8(4): 1782-1789, 2017.
Zhou et al., "An alternative for including phasor measurements in state estimators", IEEE Transactions on Power Systems, 21(4):1930-1937, 2006.

(56) References Cited

OTHER PUBLICATIONS

Zhu et al., "Bad data identification when using phasor measurements" In 2007 IEEE Lausanne Power Tech, pp. 1676-1681 IEEE, 2007.

* cited by examiner

SYSTEMS AND METHODS OF BAD DATA IDENTIFICATION AND RECOVERY FOR ELECTRIC POWER SYSTEMS

CROSS-REFERENCE TO RELATED APPLICATIONS

This application claims priority to U.S. Provisional Application No. 62/932,184 filed on 7 Nov. 2019 and entitled "Method of Online Bad Data Identification and Recovery Using A Two-stage Autoencoder," and is herein incorporated by reference in its entirety.

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to the software and data as described below and in drawings that form a part of this document: Copyright, GEIRI North America, All Rights Reserved.

FIELD OF TECHNOLOGY

The present disclosure generally relates to electric power transmission and distribution systems, and, more particularly, to systems and methods of identifying and correct bad data measured in electric power systems.

BACKGROUND OF TECHNOLOGY

The wide area measurement system (WAMS) based on phasor measurement units (PMUs) is widely recognized as one of the key enabling technologies of smart grids. With increasing deployment of PMUs and the resulting explosion in data volume, it becomes quite challenging to design an efficient communication and computing infrastructure to maintain system resilience against bad data and malicious attacks. Synchrophasor-based state estimation, linear state estimation (LSE) as an example, is a key application designed for such purpose (A G Phadke, J S Thorp, R F Nuqui, and M Zhou, "Recent developments in state estimation with phasor measurements" in 2009 IEEE/PES Power Systems Conference and Exposition, pages 1-7. IEEE, 2009). LSE yields high time-resolution estimations of system states in a non-iterative way by leveraging high reporting rate of PMUs (Arun G Phadke and John Samuel Thorp, "Synchronized phasor measurements and their applications", volume 1, Springer, 2008). However, these types of non-iterative methods, although fast, are unavoidably sensitive to bad data. Latest research reveals that certain types of bad data are even undetectable to state estimation (X. Wang, D. Shi, J. Wang, Z. Yu, and Z. Wang, "Online identification and data recovery for PMU data manipulation attack", IEEE Transactions on Smart Grid, 10(6):5889-5898, 2019, and S. Pal, B. Sikdar, and J. H. Chow, "Classification and detection of PMU data manipulation attacks using transmission line parameters", IEEE Transactions on Smart Grid, 9(5):5057-5066, 2018). The consequential estimation results can deviate from the actual states and lead to undesired responses to upper-level situational awareness and system control algorithms. Therefore, it is in great need to develop approaches that can identify and in the meantime recover bad data in synchrophasor measurements.

Recent years have witnessed an increasing number of reports on various PMU data quality issues. For instance, CAISO claims that the bad data ratio in their system can be as high as 17% (California-ISO. Five year synchrophasor plan, https://www.caiso.com/Documents/FiveYearSynchrophasorPlan.pdf, last accessed Sep. 18, 2019). In practice, bad data can be caused by malfunction of the PMU instrumentation channel, interference during the communication, or external malicious data attacks. Some of them can be easily identified through simple plausibility check, e.g., zero or negative voltage magnitude, measurements with several orders of difference in magnitude from expected values, etc. However, as their occurrences and patterns tend to be random in certain degree, most of them are not obvious and can be difficult to identify.

The exiting schemes of bad data detection and identification can be categorized into statistical approaches and feature-based ones (A. Monticelli, "Electric power system state estimation", Proceedings of the IEEE, 88(2):262-282, 2000). They can also be classified into pre-estimation and post-estimation filtering processes depending upon their positions in the state estimation chain. Most statistical methods deal with residuals of state estimation and therefore belong to the post-estimation filtering process (Jun Zhu and Ali Abur, "Bad data identification when using phasor measurements", IEEE Lausanne Power Tech, pages 1676-1681. IEEE, 2007). This type of methods require measurement redundancy and removes bad data in a recursive manner (B M Zhang, S Y Wang, and ND Xiang, "A linear recursive bad data identification method with real-time application to power system state estimation", IEEE transactions on power systems, 7(3):1378-1385, 1992). Authors of L. Vanfretti, J. H. Chow, S. Sarawgi, and B. Fardanesh, "A phasor-data-based state estimator incorporating phase bias correction", IEEE Transactions on Power Systems, 26(1):111-119, 2011 propose an approach for identifying and correcting bias errors in phase angle measurements using an iterative least squares approach. Papers, M. Zhou, V. A. Centeno, J. S. Thorp, and A. G. Phadke, "An alternative for including phasor measurements in state estimators", IEEE Transactions on Power Systems, 21(4):1930-1937, 2006, L. Zhang, A. Bose, A. Jampala, V. Madani, and J. Giri, "Design, testing, and implementation of a linear state estimator in a real power system" IEEE Transactions on Smart Grid, 8(4):1782-1789, 2017, and Aleksandar Jovicic and Gabriela Hug, "Linear state estimation and bad data detection for power systems with RTU and PMU measurements", 01 2020, present bad data identification algorithms by checking the normalized residuals using statistical tests, chi-square test as an example, within LSE using iterations. In general, statistical approaches suffer from two drawbacks. First, certain types of bad data, e.g., ones on critical measurements, are unidentifiable. Second, as the number of bad data grows, multiple iterations are needed which leads to increased computation time and undermines the non-iterative merit of LSE. Therefore, statistical methods alone are not enough to be used for online LSE considering their disadvantages.

A Kalman filter based pre-estimation approach is proposed in M. Pignati, L. Zanni, S. Sarri, R. Cherkaoui, J. Le Boudec, and M. Paolone, "A pre-estimation filtering process of bad data for linear power systems state estimators using PMUs", Power Systems Computation Conference, pages 1-8, 2014 for bad data identification by detecting abrupt changes among consecutive measurements. However, such methods depend on internal model assumption and can sometimes cause delay in real-time application. Feature-based methods originate from simple logical approaches based on observed patterns (Chulin Wan, Haoyong Chen, Manlan Guo, and Zipeng Liang, "Wrong data identification and correction for WAMs", IEEE PES Asia-Pacific Power and Energy Engineering Conference (APPEEC), pages 1903-1907. IEEE, 2016). The efficiency of such methods is generally higher than statistical ones, but the feature selection process heavily relies on human observation, which has limited capability in identifying random and complex patterns. Hui Li, "A method of bad data identification based on wavelet analysis in power system", IEEE International Conference on Computer Science and Automation Engineering (CSAE), volume 3, pages 146-150. IEEE, 2012 presents a wavelet transformation based approach which aims to relieve human efforts. Recognizing the low-rank feature of synchrophasors from adjacent channels. Mang Liao, Di Shi, Zhe Yu, Wendong Zhu, Zhiwei Wang, and Yingmeng Xiang, "Estimate the lost phasor measurement unit data using alternating direction multipliers method", IEEE/PES Transmission and Distribution Conference and Exposition (T&D), pages 1-9. IEEE, 2018 proposes a matrix recovering technique which can be utilized to identify and recover bad data. Authors in X. Deng, D. Bian, D. Shi, W. Yao, L. Wu, and Y. Liu, "Impact of low data quality on disturbance triangulation application using high-density PMU measurements" IEEE Access, 7:105054-105061, 2019 present a low-pass filter for removing spikes in the measurements, which is less effective for other types of bad data. The aforementioned methods either only work for bad data whose patterns are determined a priori or are too computationally intensive to be applied in real time to work with LSE.

As such, it is desired to develop approaches that can adaptively learn and identify patterns of bad data and then efficiently correct the bad data.

SUMMARY OF DESCRIBED SUBJECT MATTER

The presently disclosed embodiments relate to systems and methods for bad measurement data identification and correction in electric power systems.

In some embodiments, the present disclosure provides an exemplary technically improved computer-based systems and methods for processing measurement data in an electric power system which include acquiring the measurement data by a phasor measurement unit (PMU) coupled to a line of the electric power system, and inputting a plurality of the measurement data within a predetermined time window into a K-nearest neighbor (KNN) for identifying bad data among the plurality of the measurement data, wherein when one of the plurality of measurement data contains a bad datum, the machine learning module sends the bad datum to a denoising autoencoder module for correcting the bad datum, wherein the denoising autoencoder module outputs a corrected part corresponding to the bad datum, and when one of the plurality of measurement data contains no bad datum, the machine learning module bypasses the denoising autoencoder module and outputs the one of the plurality of measurement data as an untouched part.

In some embodiments, the untouched part and the corrected part are combined to form a recovered data stream.

In some embodiments, the denoising autoencoder module includes a magnitude recovery denoising autoencoder and an angle recovery denoising autoencoder, wherein when the bad datum contains only a bad magnitude, the bad datum is only sent to the magnitude recovery denoising autoencoder for the correction, when the bad datum contains only bad angle, the bad datum is only sent to the angle recovery denoising autoencoder for the correction, and when the bad datum contains both bad magnitude and bad angle, the bad datum is sent to both the magnitude recovery denoising autoencoder and the angle recovery denoising autoencoder for the correction.

In some embodiments, the measurement data received by the machine learning module are always from a predetermined PMU. In some other embodiments, the measurement data received by the machine learning module are from a first PMU at a first time and a second PMU at a second time different from the first time via a data bus.

BRIEF DESCRIPTION OF THE DRAWINGS

Various embodiments of the present disclosure can be further explained with reference to the attached drawings, wherein like structures are referred to by like numerals throughout the several views. The drawings shown are not necessarily to scale, with emphasis instead generally being placed upon illustrating the principles of the present disclosure. Therefore, specific structural and functional details disclosed herein are not to be interpreted as limiting, but merely as a representative basis for teaching one skilled in the art to variously employ one or more illustrative embodiments.

FIG. 1 shows a flowchart illustrating an exemplary bad data filtering process in accordance with embodiments of the present disclosure.

FIG. 2 shows a block diagram illustrating a bad data filter in accordance with embodiments of the present disclosure.

FIG. 3 illustrates a special type of neural network architecture for the DA used in embodiments of the present disclosure.

FIG. 4 illustrates an online implementation of the bad data filtering process in accordance with embodiments of the present disclosure.

FIG. 5 shows a block diagram illustrating a multi-thread parallel processing system according to an embodiment of the present disclosure.

FIG. 6 shows a flowchart illustrating an exemplary application of the bad data identification and recovery process in an electric power system.

FIG. 7 illustrates a topology of an IEEE 14-bus system.

FIG. 8 shows comparisons of the recovered data to the original and target data under the IEEE 14-bus simulation case.

FIG. 9 shows average and maximum estimation error comparison between LSE and MF-LSE under the IEEE 14-bus test case.

FIG. 10 shows a state estimation comparison under a bad data on critical measurement scenario.

FIG. 11 shows a state estimation comparison under a homogeneously interacting bad data scenario FIG. 12 shows sensitivity of accuracy to loading conditions under different bad PMU numbers FIG. 13 shows Jiangsu province geographic PMU placement.

FIG. 14 shows a comparison of the recovered data to the original and target data in three-phase.

DETAILED DESCRIPTION

Figure 1:
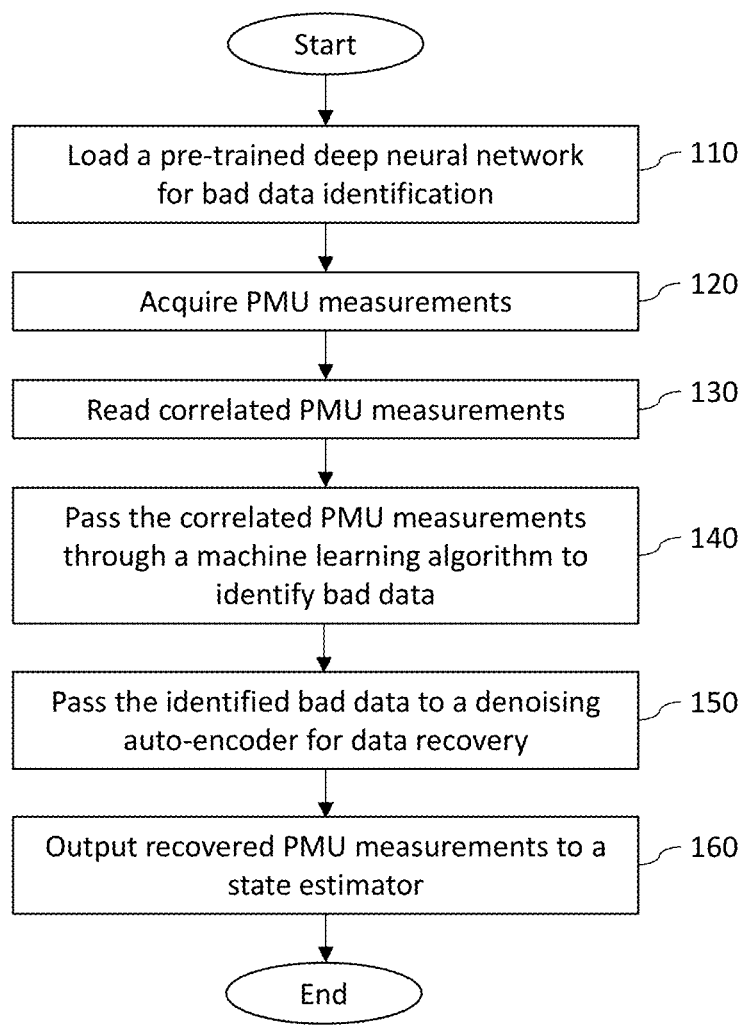
FIGS. 1-14 show one or more schematic flow diagrams, certain computer-based architectures, and/or computer-generated plots which are illustrative of some exemplary aspects of at least some embodiments of the present disclosure.

The present disclosure relates to bad data filtering systems and methods for synchrophasor-based state estimation. Various detailed embodiments of the present disclosure, taken in conjunction with the accompanying figures, are disclosed herein; however, it is to be understood that the disclosed embodiments are merely illustrative. In addition, each of the examples given in connection with the various embodiments of the present disclosure is intended to be illustrative, and not restrictive.

Throughout the specification, the following terms take the meanings explicitly associated herein, unless the context clearly dictates otherwise. The phrases "in one embodiment" and "in some embodiments" as used herein do not necessarily refer to the same embodiment(s), though it may. Furthermore, the phrases "in another embodiment" and "in some other embodiments" as used herein do not necessarily refer to a different embodiment, although it may. Thus, as described below, various embodiments may be readily combined, without departing from the scope or spirit of the present disclosure.

In addition, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

As used herein, the terms "and" and "or" may be used interchangeably to refer to a set of items in both the conjunctive and disjunctive in order to encompass the full description of combinations and alternatives of the items. By way of example, a set of items may be listed with the disjunctive "or", or with the conjunction "and." In either case, the set is to be interpreted as meaning each of the items singularly as alternatives, as well as any combination of the listed items.

In present disclosure, a two-stage machine learning based filtering approach is proposed which not only identifies bad synchrophasor measurements but also, in some extent, recovers or corrects them. Working with LSE as a pre-conditioning scheme, the proposed system and method are highly efficient especially when multiple bad data coexist, which is common in practice. In the first stage, patterns of bad data are identified using a K-Nearest Neighbor (KNN) based classifier. Then a neural network with the denoising autoencoder (DA) architecture is proposed to recover the bad data. Both the KNN classifier and the DA can be pre-trained by PMU measurements and therefore the proposed filter is purely data-driven and model-free. The proposed filter can be carried out at the device level without knowledge of the system and its parameters, and multi-thread parallel processing can be achieved to maximize the processing efficiency for real-time applications.

The remainder of this specification is organized as follows. Section I briefly reviews the basics of linear state estimation and its bad data removal process. Section II introduces the proposed methodology and its implementation for parallel processing in an electric power system. Experimental results and case studies are presented in section III.

Section I. Linear State Estimation

Linear state estimation is a fast state estimation method to obtain the real-time states of power systems by leveraging the linear relationship between the PMU measurements and system voltage phasors. The PMUs are usually installed at the terminals of lines, and their measurements include the 3-phase current and voltage phasors in polar coordinates. Transmission systems are usually considered to be three-phase-balanced in the analysis. Hence, positive sequence measurements can be extracted from the 3-phase measurements through the phase to sequence transformation in equation (1), where $V_{012}$ denotes the sequence voltage phasor vector that includes zero, positive and negative sequence labeled as 0, 1, and 2 respectively. $V_{ABC}$ is the three-phase voltage phasor vector of A, B and C phases directly from PMU measurements. Transmission-level LSE is generally implemented upon the positive sequence measurements.

$$V_{012} = \frac{1}{3}\begin{bmatrix} 1 & 1 & 1 \\ 1 & \alpha & \alpha^2 \\ 1 & \alpha^2 & \alpha \end{bmatrix} V_{ABC} \quad (1)$$

For a system with N nodes and L lines, in which some nodes and lines are deployed with PMUs so that there are n voltage measurements and l current measurements, the state vector $\vec{x} \in \mathbb{C}^{N \times 1}$ includes the voltage phasors of all nodes. The measurement vector $\vec{z} \in \mathbb{C}^{(n+l) \times 1}$ includes the voltage and current phasors of the terminals with PMU installation. The measurement model of PMU data can be derived from Ohm's law as formulated in equation (2), where $A \in \mathbb{R}^{n \times N}$ is the relationship matrix between the state vector $\vec{x}$ and voltage phasor measurement vector $\vec{V}$. If the voltage phasor of node j is the $i^{th}$ component in the measurement vector of voltage phasors, then $A_{i,j}=1$; otherwise $A_{i,j}=0$, where $A_{i,j}$ is the element of A on the $i^{th}$ row and $j^{th}$ column. Matrix $Y_f \in \mathbb{C}^{l \times N}$ is the from-end system admittance matrix used to calculate the current injection at the "from" end of the measured lines. By combining the voltage and current measurements into one formulation, the measurement model of PMU data can be represented by the complex matrix $H$ in equation (3).

$$\begin{cases} \vec{V} = A\vec{x} \\ \vec{I}_f = Y_f \vec{x} \end{cases} \quad (2)$$

$$\vec{z} = \begin{bmatrix} \vec{V} \\ \vec{I}_f \end{bmatrix} = \begin{bmatrix} A \\ Y_f \end{bmatrix} \vec{x} = H\vec{x} \quad (3)$$

Although the model in equation (3) is linear, its components are complex numbers. It can be further expanded into a rectangular-coordinate formulation in equation (4). The corresponding measurement model becomes equation (5), where $H_{real}$ and $H_{imag}$ are the real and imaginary part, respectively, of the $H$ matrix. Matrix $\hat{H}$ represents the linear model for linear state estimation in rectangular form.

$$x = \begin{bmatrix} \text{real}(\vec{x}) \\ \text{imag}(\vec{x}) \end{bmatrix}, z = \begin{bmatrix} \text{real}(\vec{z}) \\ \text{imag}(\vec{z}) \end{bmatrix} \quad (4)$$

$$z = \begin{bmatrix} H_{real} & -H_{imag} \\ H_{imag} & H_{real} \end{bmatrix} x = \hat{H}x \quad (5)$$

Based on the formulation in equation (5), it is possible to solve for the states directly. The solution of x is given in equation (6), where the weighted pseudo-inverse of H is calculated using the Moore-Penrose method (E. H. Moore, "On the reciprocal of the general algebraic matrix," Bull. Am. Math. Soc., vol. 26, pp. 394-395, 1920). Matrix W∈ $\mathbb{R}^{(n+l)\times(n+l)}$ is a diagonal matrix, of which the diagonal components are weights for the corresponding measurements.

$$\hat{x}=(H^TW^{-1}H)^{-1}H^TW^{-1}z \qquad (6)$$

The bad data identification and removal criteria of LSE is based on the value of normalized measurement residual $r_i^N$ formulated in equation (7), where $r_i$ denotes the measurement residual of the $i^{th}$ measurement, calculated from (8). Matrix $\Omega$ is the covariance matrix of measurement residual calculated from equation (9). At each iteration of bad data identification and removal, if the highest normalized residual is above 3.0, the corresponding measurement is then regarded as an outlier and can be removed. The threshold 3 indicates that the measurement is 3-sigma away from the estimated value assuming the measurement error is normally distributed, which means there is only a 0.3% chance for such a large deviation of the data point from the estimated value to happen. After removal of the bad data, the LSE is performed again with the updated weight matrix and measurement model for the next iteration until the highest normalized residual is less than three.

$$r_i^N = \frac{|r_i|}{\sqrt{\Omega_{ii}}}, i \in [1, m] \qquad (7)$$

$$r = z - H\hat{x} \qquad (8)$$

$$\begin{cases} G = H^TWH \\ K = HG^{-1}H^TW \\ S = I - K \\ \Omega = SW^{-1} \end{cases} \qquad (9)$$

Section II. Exemplary Methodology and Implementation of Propose Bad Data Filter

FIG. 1 shows a flowchart illustrating an exemplary bad data filtering process in accordance with embodiments of the present disclosure. The bad data filtering process begins with step 110 in which a pre-trained neural network for bad data identification is loaded in a bad data filtering system. In step 120, the bad data filtering system acquires PMU measurements. As PMUs are dispersed throughout the electric power system, a PMU data concentrator is used to collect the and correlate PMU measurements. In step 130, the correlated PMU measurements are read into the bad data filtering system. In step 140, the correlated PMU measurements are passed through a deep learning algorithm to identify any bad data in the correlated PMU measurements. In some embodiments, the deep learning algorithm uses a K-nearest neighbor (KNN) model. In step 150, the identified bad data is exemplarily passed to a denoising auto-encoder (DA) for data recovery. In step 160, the recovered PMU measurements are then outputted to a state estimator.

Figure 2:
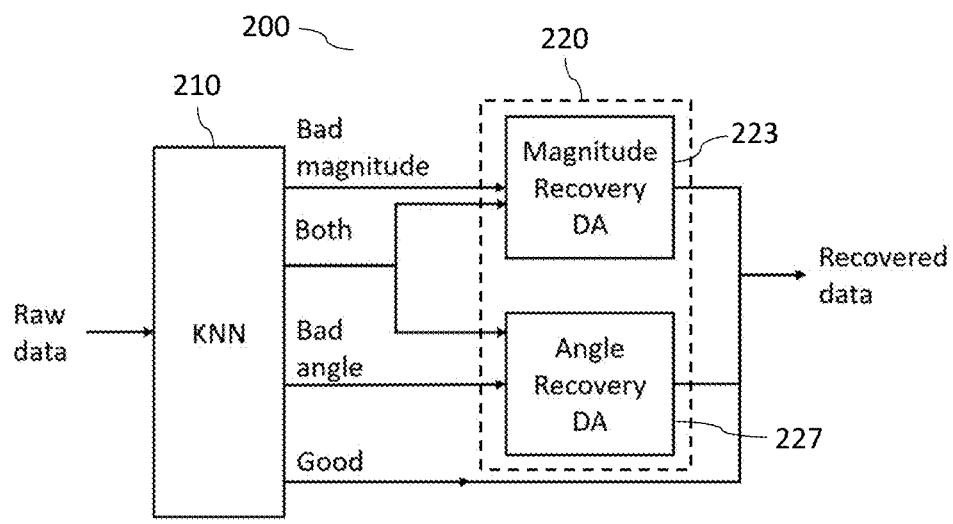

FIG. 2 shows a block diagram illustrating a bad data filter 200 in accordance with embodiments of the present disclosure. The bad data filter 200 combines a bad data identification module 210 with a bad data recovery module 220. In some embodiments, the bad data identification module 210 is implemented with a KNN-based classifier. The bad data recovery module 220 exemplarily has a magnitude recovery DA 223 and an angle recovery DA 227. The two recovery DAs 223 and 227 are trained independently offline. Should good measurements be received, the recovery module 220 is bypassed, however, the bad data identification module 210 may alter measurements slightly even if the input is not corrupted. Should bad measurements be received, their magnitudes and angles are recovered separately by the magnitude recovery DA 223 and the angle recovery DA 227, respectively, because their values are at different scales and have different patterns. If only magnitude is compromised, the angle recovery DA 227 is bypassed; similarly, if only angle is compromised, the magnitude recovery DA 223 is bypassed. The recovered parts will be reconnected with the untouched parts to construct final outputs of recovered data.

In some embodiments, an input of the bad data filter 200 is a 12×T matrix consisting of raw measurement data vectors within the T-step sliding window. The recommended size of T is 0.2-0.5 times of PMU reporting rate for better filtering performance. Each column is a measurement vector, including the three-phase voltage and current phasors in polar coordinates. Equation (10) demonstrates the input data format. The size of the sliding window we choose in this study is 12 to make the input data a rectangular matrix, but this hyperparameter can be tuned according to needs. Typically the longer the window size, the better capability to identify bad data with longer duration. Longer size, nevertheless, sacrifices the ability to capture system dynamics to some extent.

$$\begin{bmatrix} V_{mag,A}^{t-11} & V_{mag,A}^{t-10} & \cdots & V_{mag,A}^{t-1} & V_{mag,A}^{t} \\ V_{mag,B}^{t-11} & V_{mag,B}^{t-10} & \cdots & V_{mag,B}^{t-1} & V_{mag,B}^{t} \\ V_{mag,C}^{t-11} & V_{mag,C}^{t-10} & \cdots & V_{mag,C}^{t-1} & V_{mag,C}^{t} \\ I_{mag,A}^{t-11} & I_{mag,A}^{t-10} & \cdots & I_{mag,A}^{t-1} & I_{mag,A}^{t} \\ I_{mag,B}^{t-11} & I_{mag,B}^{t-10} & \cdots & I_{mag,B}^{t-1} & I_{mag,B}^{t} \\ I_{mag,C}^{t-11} & I_{mag,C}^{t-10} & \cdots & I_{mag,C}^{t-1} & I_{mag,C}^{t} \\ V_{ang,A}^{t-11} & V_{ang,A}^{t-10} & \cdots & V_{ang,A}^{t-1} & V_{ang,A}^{t} \\ V_{ang,B}^{t-11} & V_{ang,B}^{t-10} & \cdots & V_{ang,B}^{t-1} & V_{ang,B}^{t} \\ V_{ang,C}^{t-11} & V_{ang,C}^{t-10} & \cdots & V_{ang,C}^{t-1} & V_{ang,C}^{t} \\ I_{ang,A}^{t-11} & I_{ang,A}^{t-10} & \cdots & I_{ang,A}^{t-1} & I_{ang,A}^{t} \\ I_{ang,B}^{t-11} & I_{ang,B}^{t-10} & \cdots & I_{ang,B}^{t-1} & I_{ang,B}^{t} \\ I_{ang,C}^{t-11} & I_{ang,C}^{t-10} & \cdots & I_{ang,C}^{t-1} & I_{ang,C}^{t} \end{bmatrix} \qquad (10)$$

As shown in FIG. 2, the bad data identification module 210 is implemented with a KNN model for its low training complexity, powerful classification capability and tuning simplicity. KNN is one of the most used machine learning algorithms in data analytics. It can be used as a regression model to perform value prediction or as a clustering model to perform classification. The identification of bad data is a classification task that make decisions upon the weighted majority vote of the j nearest data in terms of Euclidean distance. The dimension of the input is the number of measurements in the input data, and the output space includes four classes: good data, magnitude compromised bad data, angle compromised bad data and both magnitude and angle compromised data.

While there are other definitions of distance that can be adopted in the aforemensioned algorithm, the Euclidean distance is exemplarily chosen for the bad data identification module because of its effectiveness and relatively low computational complexity for high dimensional data. Equation (11) shows the formulation of Euclidean distance between two data point x and y of d dimensions, where $x_i$ and $y_i$ are the $i^{th}$ dimension of each data point.

$$\text{Dist}(x,y) = \sqrt{\sum_{i=1}^{d}(x_i - y_i)^2} \quad (11)$$

As the identification of bad data is dependent on the weighted majority vote of the j nearest labeled data, the weights should be proportional to the inverse of their distance and regularized to the sum of 1 as formulated in equation (12). Variable $w_i$ denotes the weight on the $i^{th}$ neighbor, and $D_i$ is the distance between the new data and the $i^{th}$ neighbor.

$$\begin{cases} \sum_{i=1}^{k} w_i = 1 \\ w_i \propto \dfrac{1}{D_i} \end{cases} \quad (12)$$

An in-sample training error is denoted by the misclassification rate (MR) formulated in equation (13), where FP is false positive, denoting the number of good data identified as bad data, FN is false negative, denoting the number of bad data identified as good data and $N_{Total}$ is the total number of instances of the training data set. The sum of FP and FN is the total number of misclassified data points. The evaluation metrics of bad data identification on the testing data set are the precision, recall and F1 score formulated in equation (13), where the TP is true positive, denoting the number of correctly identified bad data. The F1 score is a less biased metric compared to the misclassification rate, considering that the number of correctly identified good data would dominate the misclassification rate as the majority of the data are good data. The relation between precision and recall reflects the tendency of over-kill or under-kill of the classification model.

$$MR = \frac{FP + FN}{N_{Total}} \quad (13)$$

$$\begin{cases} \text{Precision} = \dfrac{TP}{TP + FP} \\ \text{Recall} = \dfrac{TP}{TP + FN} \\ F1 = 2 \times \dfrac{\text{Precision} \times \text{Recall}}{\text{Precision} + \text{Recall}} \end{cases} \quad (14)$$

As shown in FIG. 1, once a bad measurement data is identified in step 140, the next step is to recover it to a corresponding true value in step 150. In some embodiments, a denoising autoencoder (DA) is used to perform the data recovery. DAs are widely used for data recovery in image processing which is similar to PMU data processing in that they are both essentially matrix reconstruction tasks.

Figure 3:
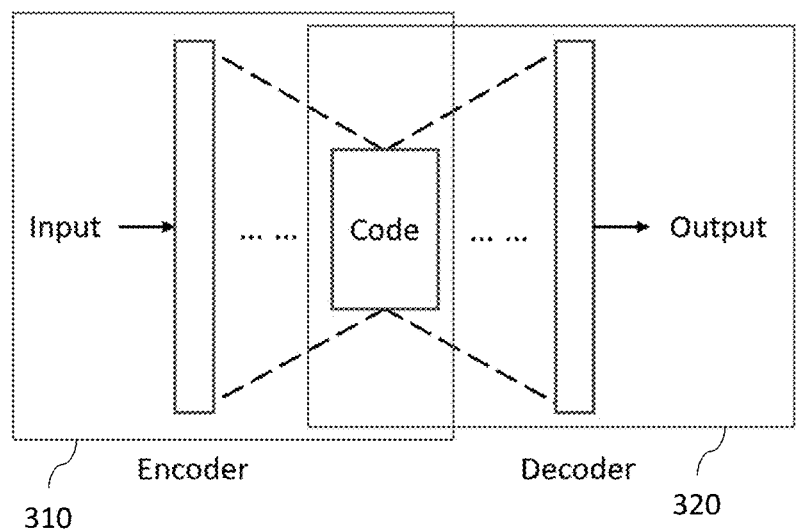

FIG. 3 illustrates a special type of neural network architecture for the DA used in embodiments of the present disclosure. The illustrated neural network has symmetrical layers. Dimensions of the input and output of the neural network are the same and the training objective is to reproduce the input data at the output. A first half of the neural network is an encoder 310, and a second half is a decoder 320.

The encoder 310 can be interpreted as a nonlinear principal component analysis (PCA) process that transforms the corrupted PMU data into a feature space that enables the decoder 320 of the network to reconstruct from Matthias Scholz and Ricardo Vigário, "Nonlinear PCA: a new hierarchical approach", in Esann, pages 439-444, 2002. The DA is trained with intentionally corrupted PMU data as input and the correct data as the target of the output so that a trained DA is expected to reconstruct the most accurate PMU data from a corrupted one while filtering out the noise and abnormal value in it.

An error evaluation metric of the DA is the root mean square error (RMSE) between the recovered data and target data as formulated in equation (15), where N is the size of the training data set, x and y represents the recovered data and target data, respectively. The error of all elements within the sliding window is considered, and M denotes the number of input measurements and S is the time span of the sliding window.

$$RMSE_{DA}(x, t) = \frac{1}{N}\sum_{n=1}^{N}\left(\sqrt{\frac{1}{M \times S}\sum_{i=1}^{M}\sum_{j=1}^{S}(x_{i,j} - y_{i,j})^2}\right) \quad (15)$$

Figure 4:
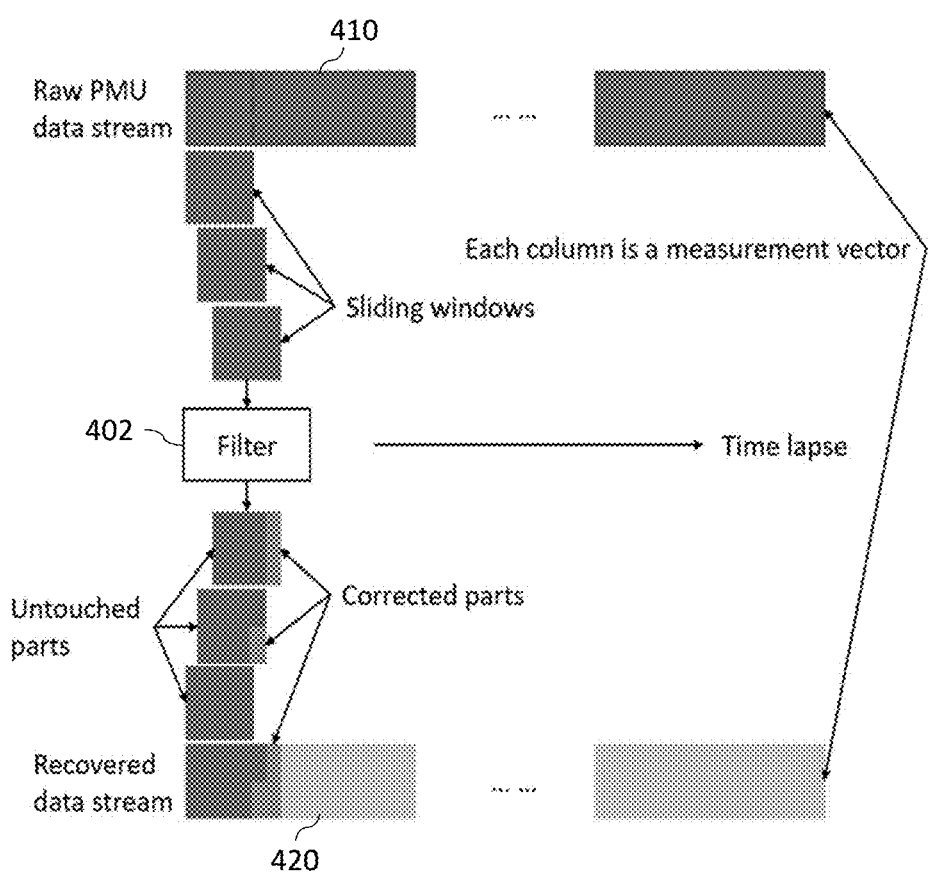

FIG. 4 illustrates an online implementation of the bad data filtering process in accordance with embodiments of the present disclosure. A filter 402 moves forward along a time axis, identifying and recovering bad data in the raw data stream 410. The parts without bad data remain untouched, and the corrected parts are embedded in the recovered data stream 420. With such implementation, data quality can be improved for online applications in real-time.

Another critical requirement of online implementation is the efficiency of data processing. PMU reporting rate is usually 25-60 Hz. Hence, the processing capability of the filter is preferred to match the PMU reporting rate to avoid data stacking for many real-time applications.

Figure 5:
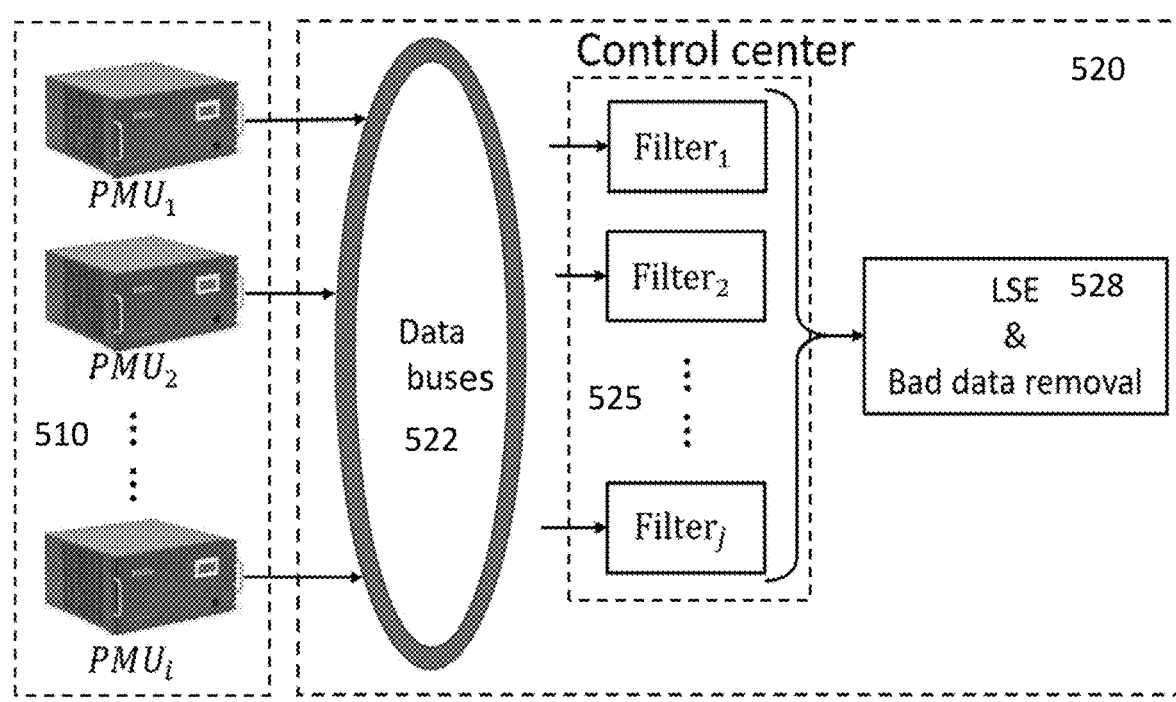

FIG. 5 shows a block diagram illustrating a multi-thread parallel processing system according to embodiments of the present disclosure. The multi-thread parallel processing system has a plurality of PMUs 510 and a control center 520 which include a data bus 522, a plurality of bad data filters 525 and a LSE module 528. As the bad data filter 525 can be applied device-wise, each filter 525 processes single PMU data independently. This makes parallel processing possible. Assume there are i number of PMUs 510 and j threads of bad data filters 525. The data are injected into the data buses 522, where they keep looking for available bad data filters 525 until being processed by one. The bad data filters 525, on the other hand, will be waiting for the next data after finishing an existing one. In this way, if the average processing frequency (including the data transferring time) of the filters 525 is k times higher than the PMU reporting rate, where k≥1, then j≥[i/k] must be satisfied. The multi-thread parallel processing system shown in FIG. 5 can reduce processing time.

Figure 6:
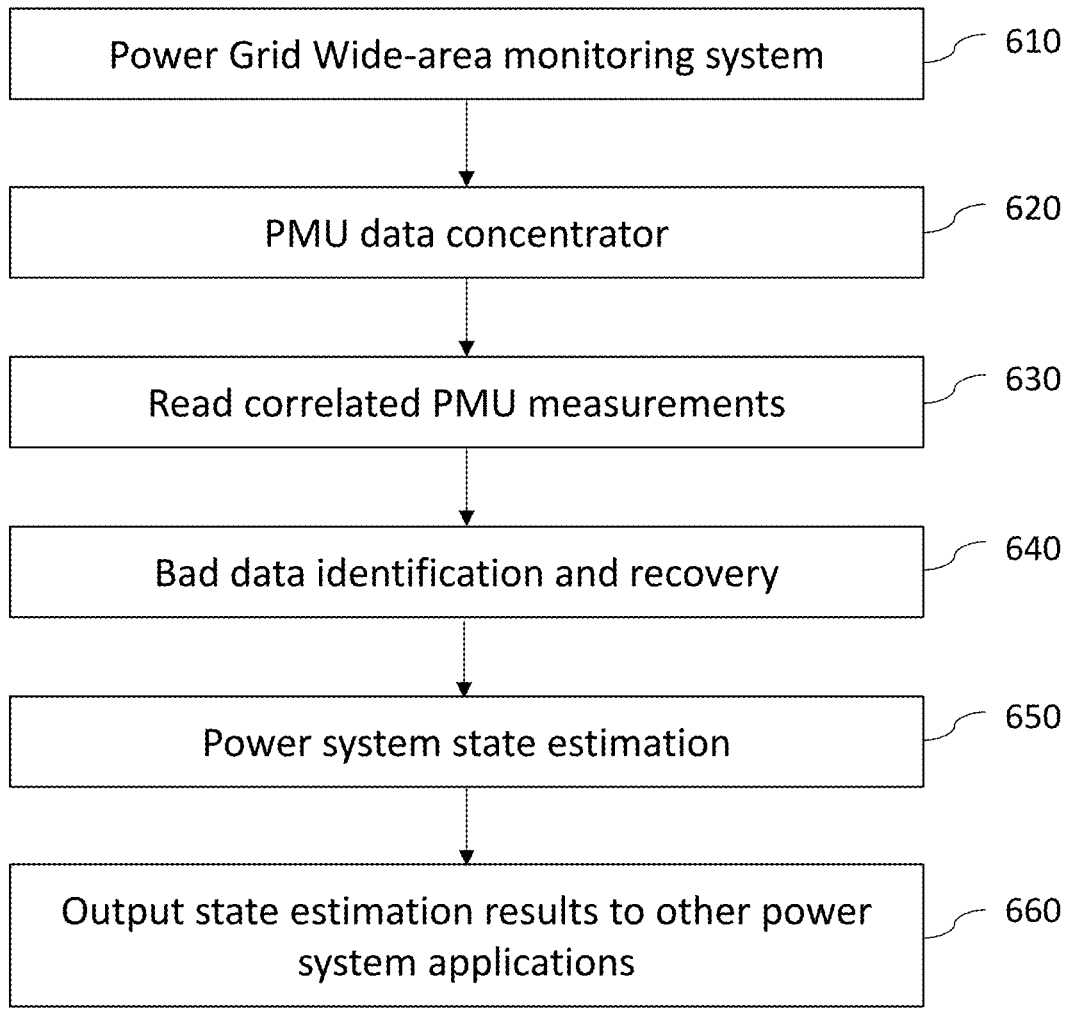

FIG. 6 shows a flowchart illustrating an exemplary application of the bad data identification and recovery process in an electric power system in accordance with embodiments of the present disclosure. The electric power grid system is monitored by a wide-area monitoring system in step 610. A PMU data concentrator collects and correlates multiple PMU measurements in step 620. Then the correlated PMU measurements are read into a control system in step 630. The control system runs bad data identification and recovery processes on the correlated PMU measurements according to embodiments of the present disclosure in step 640. Then the processed data is fed to power system state estimation in step 650. In step 660, state estimation results are outputted to other power system applications.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that make the logic or processor. Of note, various embodiments described herein may, of course, be implemented using any appropriate hardware and/or computing software languages (e.g., C++, Objective-C, Swift, Java, JavaScript, Python, Perl, QT, etc.).

In some embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, Software modules or components may be located in local and/or remote memory storage devices. In addition, data being tied or rendered together in a database record may be resident in the same memory device, or across several memory devices, and may be linked together in fields of a record in a database across a network.

Section III. Case Studies

Two case studies are carried out to validate and demonstrate the proposed machine learning-based bad data filtering scheme. The first case is conducted using the IEEE 14-bus system with synthetic bad data. Experimental results of LSE with and without the proposed filter are compared to demonstrate the performance of the proposed approach. The second case investigates performance of the proposed filter in a real-world system with real PMU measurements, demonstrating its benefits for LSE on large-scale systems.

3.1 Settings
a) The PMU reporting rate for the synthetic data is set to 50 Hz and in the real-world case is 25 Hz.
b) Algorithms are implemented in MATLAB 2018a under the Microsoft Windows 10 environment. The simulation is done on a computer with Intel® Core™ i5-6400 CPU@3.00 GHz Processor and 8 GB of RAM.
c) Similar to the DA evaluation metrics, the estimation error of LSE is the RMSE between the estimated states and the actual states as formulated in equation (16), where x and y are the estimated and actual states. Variable K here denotes the dimension of data and T is the number of steps.

$$RMSE_{LSE}(x, y) = \frac{1}{T}\sum_{t=1}^{T}\left(\sqrt{\frac{1}{K}\sum_{i=1}^{K}(x_{i,t} - y_{i,t})^2}\right) \quad (16)$$

3.2 Results on an IEEE 14-Bus System with Synthetic Data

Figure 7:
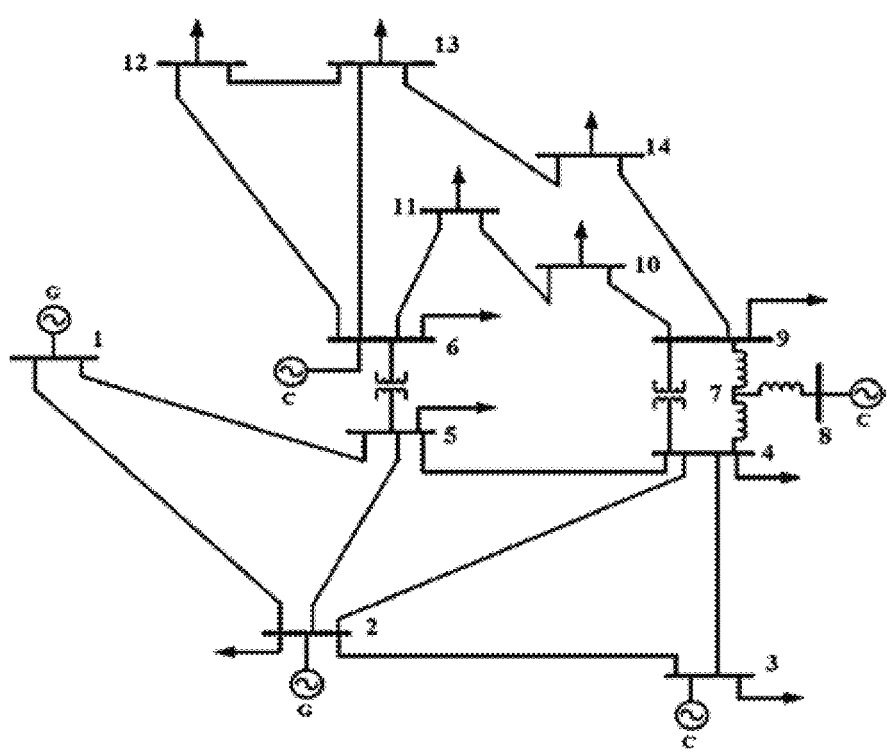

In this subsection, the proposed approach is tested using an IEEE 14-bus system under a set of random generated bad data scenarios which mimics the observed bad data scenarios in practical systems. FIG. 7 shows a topology of such a system (Iraj Dabbagchi, "IEEE 14 bus power flow test case", American Electric Power System, Golden Colo., 1962).

3.2.1 Data Generation

The measurement data containing bad data are generated according to the following assumptions:
a) PMUs are placed on all the 20 lines. The voltage phasors of their from-end buses and the current phasors of the lines are measured.
b) The bad data are applied to both voltage magnitude and angular measurements. According to the patterns recognized from real-world measurements, random voltage drops and angular shifts are injected into the simulated three-phase voltage data streams independently. The corrupted phase magnitude drops to zero and the shifted angle complies with the Gaussian distribution of N(0,0.5).
c) Bad data injected into different PMUs are independent.
d) The number of PMUs that contains bad data simultaneously is controlled. We generated 110 scenarios for each number of simultaneously bad PMU, from 1 to 20. The total number of bad data scenarios is 2200. The PMUs with bad data are randomly selected during scenario generation.

3.2.2 Model Training

The training data set contains 100 scenarios that cover all 20 simultaneously bad PMU numbers. The total number of data points in the training set is 5000, as each scenario contains a 1-second time window that corresponds to 50 data points.

The hyperparameter K of the KNN model is tuned to 3. We noticed that a larger k compromises the in-sample training accuracy due to the unbalance of the training data set. The majority of the training data points are labeled as good data, therefore, the larger the K, the higher likelihood of a bad data point to be classified as good. The hyperparameter of the autoencoder-based data recovery model is the size of its hidden layer. Considering the input and output size are 1212, we set the hidden layer size to be 300 to avoid overfitting and underfitting.

As mentioned in Section II, one of the advantages of the proposed filter is the parallel processing capability. To achieve the parallelism, each PMU needs its own pre-trained filter. The evaluation metric of KNN is the classification accuracy. DA recovery performance is evaluated upon the RMSE value between the target data and recovered data. Table 1 summarizes the training results of all 20 filters. The PMU indexes correspond to the lines being measured.

TABLE 1

Training result summary

| Line index | KNN | DA |
| --- | --- | --- |
| 1 | 99.92% | 0.0323 |
| 2 | 99.92% | 0.0212 |
| 3 | 99.82% | 0.0203 |
| 4 | 99.56% | 0.0192 |
| 5 | 99.96% | 0.0177 |
| 6 | 99.96% | 0.0419 |
| 7 | 99.99% | 0.0338 |
| 8 | 99.94% | 0.0247 |
| 9 | 99.88% | 0.0158 |
| 10 | 99.80% | 0.0212 |
| 11 | 99.96% | 0.0239 |
| 12 | 99.90% | 0.0237 |
| 13 | 99.92% | 0.0245 |
| 14 | 99.96% | 0.0249 |
| 15 | 99.94% | 0.0275 |
| 16 | 99.99% | 0.0234 |
| 17 | 99.78% | 0.0262 |
| 18 | 99.90% | 0.0241 |

TABLE 1-continued

Training result summary

| Line index | KNN | DA |
|---|---|---|
| 19 | 99.82% | 0.0274 |
| 20 | 99.96% | 0.0236 |

3.2.3 Simulation Results

Figure 8:
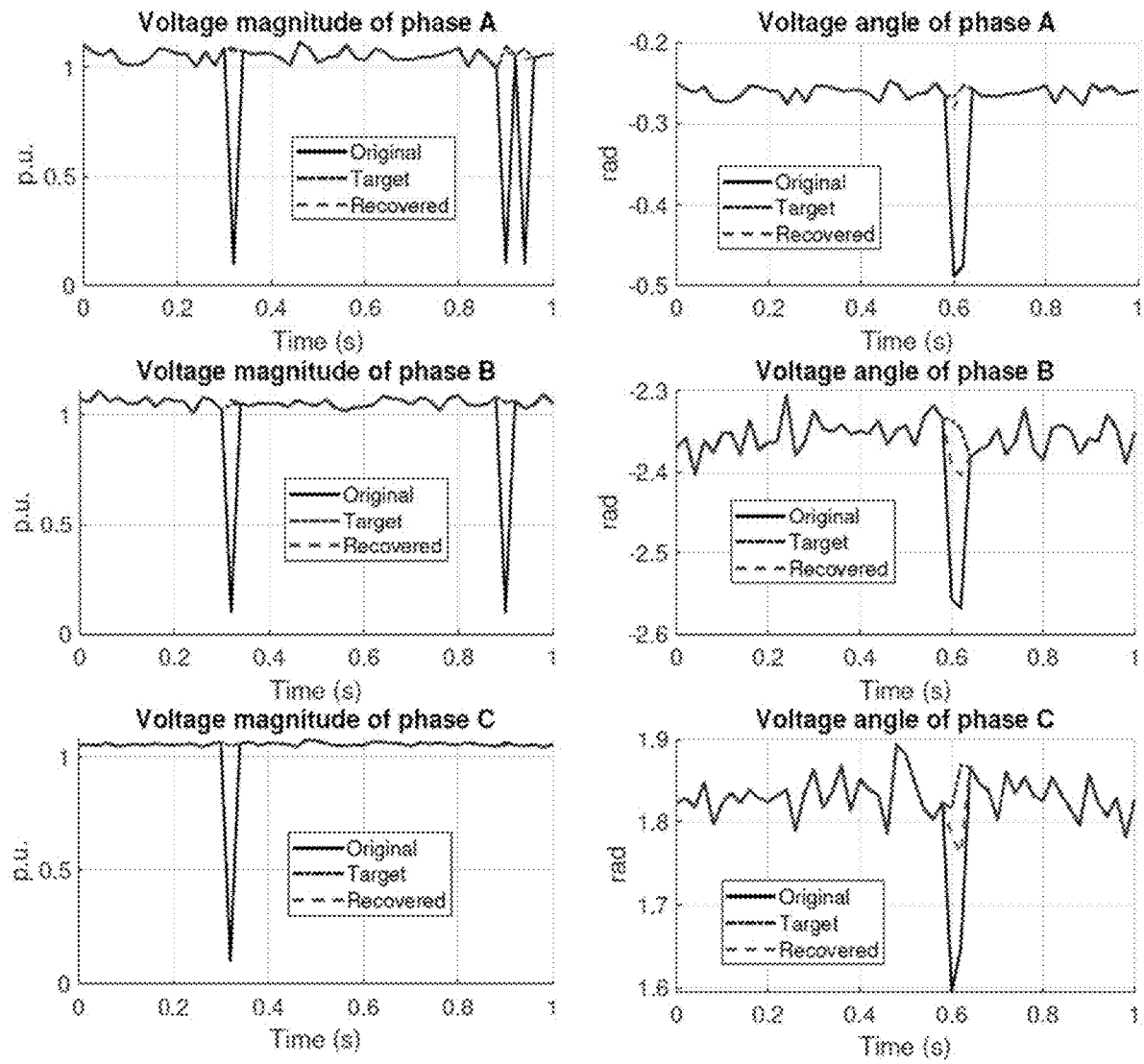

The pre-trained filters are applied to the rest of the 2000 bad data scenarios for testing. FIG. 8 shows the trajectory comparison among the original data, target data and recovered data under a single bad PMU scenario. The PMU with bad data is located on line 17, which the from-end bus is bus 9. This bad data scenario contains 3 corrupted voltage magnitudes and one period of angle shift. The 3 magnitude corruption includes 1 three-phase bad data, 1 two-phase bad data and 1 single-phase bad data. The duration of the angle shift is 2 steps. All the manipulated data are identified by KNN and well-recovered by DA. The gap between the recovered data and the target data is at the same magnitude of noise.

Table 2 summarizes the classification performance of the filters under different bad data scenarios. Each bad PMU number contains 100 repetitions of randomly generated bad data scenarios. The average precision of all scenarios is above 90%, while the recall is relatively low, indicating that the bad data identified by the proposed filter has high credibility, but it is possible to miss some of the bad data as well. This feature protects the filter from overkilling good measurements and compromising the accuracy of LSE. The missed bad data can still be removed by the bad data identification and removal of LSE.

number of simultaneously bad PMU is low. This is because the KNN-based bad data identification is not perfect and alters normal measurements more or less. With more PMU corrupted, the average estimation error of LSE increases and becomes higher than MF-LSE when 6 PMUs are corrupted. Besides the average estimation error, the maximum estimation error is more important in data filtering performance evaluation, because that is more sensitive to bad data. The dashed line in FIG. 9 denotes the averaged maximum estimation error over the 100 repetitions. LSE is affected greatly by the increase of bad data numbers, while MF-LSE maintains its estimation error under 0.1. This is mainly because when more PMU corrupted at the same time, the critical measurements are more likely to be corrupted, but the bad data identification and removal can not detect such bad data and the consequent estimation would be less accurate. However, the proposed filter is capable of identifying and restoring the corrupted data on critical measurements because it is a data-driven method that does not consider the observability of the system. As the bad data on critical measurements being restored the estimation accuracy is evidently improved.

Besides estimation accuracy, another advantage of the proposed MF is its higher time efficiency. LSE bad data identification and removal are performed in an iterative manner, which consumes a long time to solve when the bad data number is large. With the help of the proposed data pre-processing filter, most of the obvious bad data can be removed in one shot, so that the iteration of LSE bad data removal can be reduced, therefore the overall time consumption becomes less.

TABLE 2

KNN-based bad data identification performance under different numbers of simultaneously bad PMU

| Bad PMU | TP | FP | FN | TN | Precision | Recall | F1 |
|---|---|---|---|---|---|---|---|
| 1 | 33.68 | 3.69 | 8.10 | 3014.53 | 90.13% | 80.61% | 85.10% |
| 2 | 61.66 | 4.40 | 14.54 | 2979.4 | 93.34% | 80.92% | 86.69% |
| 3 | 87.13 | 6.54 | 17.55 | 2948.78 | 93.02% | 83.23% | 87.85% |
| 4 | 130.70 | 10.10 | 24.33 | 2894.87 | 92.83% | 84.31% | 88.36% |
| 5 | 150.54 | 10.25 | 29.91 | 2869.30 | 93.63% | 83.42% | 88.23% |
| 6 | 180.98 | 15.37 | 35.09 | 2828.56 | 92.17% | 83.76% | 87.76% |
| 7 | 202.86 | 16.50 | 38.36 | 2802.28 | 92.48% | 84.10% | 88.09% |
| 8 | 236.90 | 20.74 | 45.47 | 2756.89 | 91.95% | 83.90% | 87.74% |
| 9 | 254.52 | 18.50 | 41.06 | 2745.92 | 93.22% | 86.11% | 89.53% |
| 10 | 276.78 | 24.15 | 47.66 | 2711.41 | 91.97% | 85.31% | 88.52% |
| 11 | 304.53 | 28.67 | 49.17 | 2677.63 | 91.40% | 86.10% | 88.67% |
| 12 | 326.82 | 25.65 | 48.33 | 2659.20 | 92.72% | 87.12% | 89.83% |
| 13 | 338.68 | 31.90 | 57.60 | 2631.82 | 91.39% | 85.46% | 88.33% |
| 14 | 360.12 | 36.21 | 57.77 | 2605.90 | 90.86% | 86.18% | 88.46% |
| 15 | 381.60 | 37.69 | 61.13 | 2579.58 | 91.01% | 86.19% | 88.54% |
| 16 | 399.80 | 37.65 | 56.91 | 2565.64 | 91.39% | 87.54% | 89.42% |
| 17 | 412.35 | 38.67 | 61.47 | 2547.49 | 91.42% | 87.03% | 89.17% |
| 18 | 428.14 | 42.59 | 62.39 | 2526.88 | 90.95% | 87.28% | 89.08% |
| 19 | 449.75 | 41.41 | 61.67 | 2507.17 | 91.57% | 87.94% | 89.72% |
| 20 | 460.87 | 43.74 | 59.86 | 2495.54 | 91.33% | 88.51% | 89.90% |
| Overall | 5478.41 | 494.44 | 878.36 | 54348.79 | 91.72% | 86.18% | 88.87% |

Figure 9:
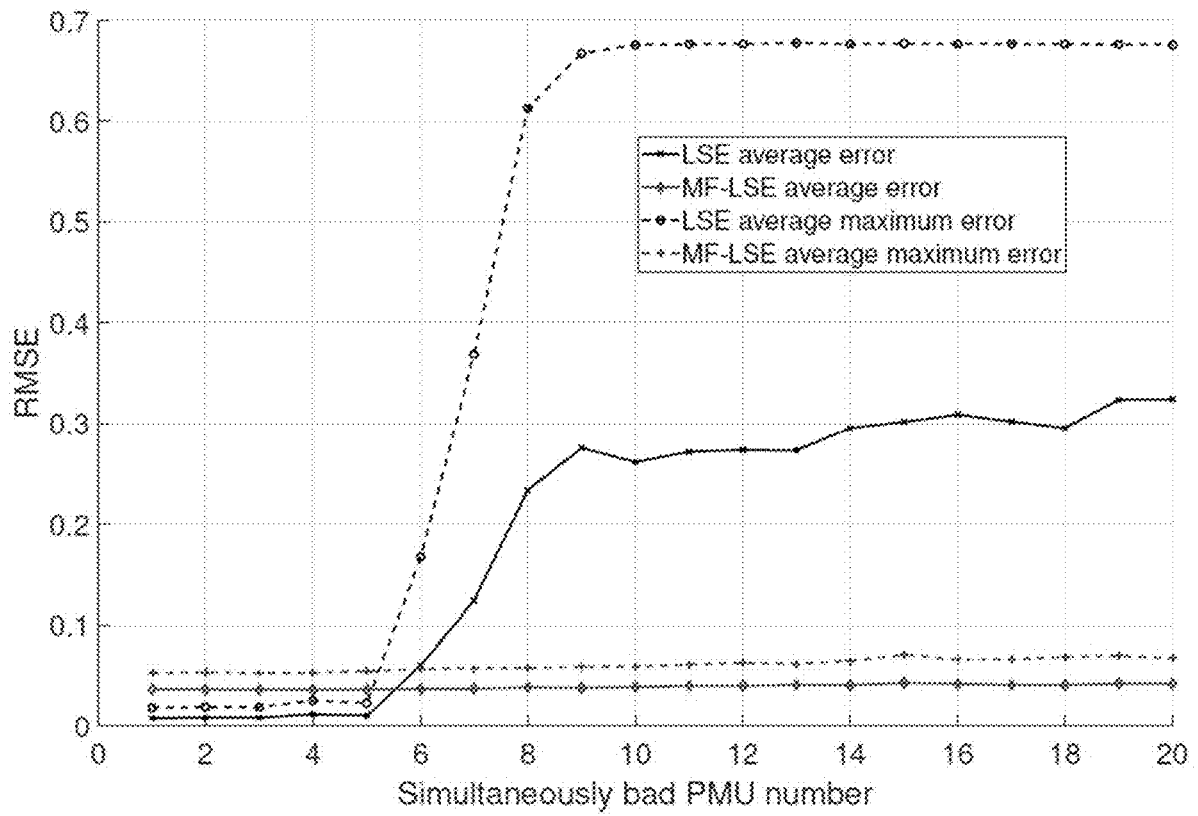

FIG. 9 compares the estimation error of LSE with and without the proposed machine learning-based filter under different number of simultaneously bad PMU. The former is labeled as MF-LSE. In terms of average estimation error, as indicated by the solid lines in FIG. 9, LSE is more accurate than MF-LSE when the PMU data quality is high and the Table 3 compares the average time consumption of data pre-processing, which is labeled as MF, LSE with data pre-processing, which is labeled as MF-LSE and LSE. The time consumption of LSE increases as the number of bad PMU increases due to more iterations. Then it saturates to approximately 28 ms because LSE cannot remove bad data on critical measurements, therefore, more bad data would not increase the number of iterations further. On the other hand, with the pre-filtered data, the MF-LSE maintains the average time consumption below 18 ms. This result indicates the proposed filter is capable of removing the majority of bad data effectively regardless of bad PMU number and improving the computational efficiency of LSE. Note that the time consumption of the pre-processing is included in the MF-LSE time.

TABLE 3

Time consumption comparison (ms)

| Bad PMU | MF | MF-LSE | LSE |
|---|---|---|---|
| 1 | 3.0 | 16.9 | 19.5 |
| 2 | 3.2 | 17.4 | 19.8 |
| 3 | 3.1 | 16.9 | 20.0 |
| 4 | 3.0 | 16.8 | 22.9 |
| 5 | 3.0 | 16.7 | 24.1 |
| 6 | 3.1 | 17.1 | 25.5 |
| 7 | 2.9 | 16.8 | 27.6 |
| 8 | 3.0 | 16.8 | 29.6 |
| 9 | 3.1 | 16.9 | 28.3 |
| 10 | 3.2 | 17.1 | 28.4 |
| 11 | 3.0 | 16.8 | 28.5 |
| 12 | 3.0 | 17.0 | 27.7 |
| 13 | 3.1 | 17.0 | 27.8 |
| 14 | 3.2 | 17.0 | 27.5 |
| 15 | 2.9 | 16.8 | 27.3 |
| 16 | 3.0 | 16.9 | 28.4 |
| 17 | 2.9 | 16.7 | 27.9 |
| 18 | 2.9 | 16.8 | 28.1 |
| 19 | 3.1 | 17.0 | 27.1 |
| 20 | 3.1 | 17.6 | 28.4 |

Figure 10:
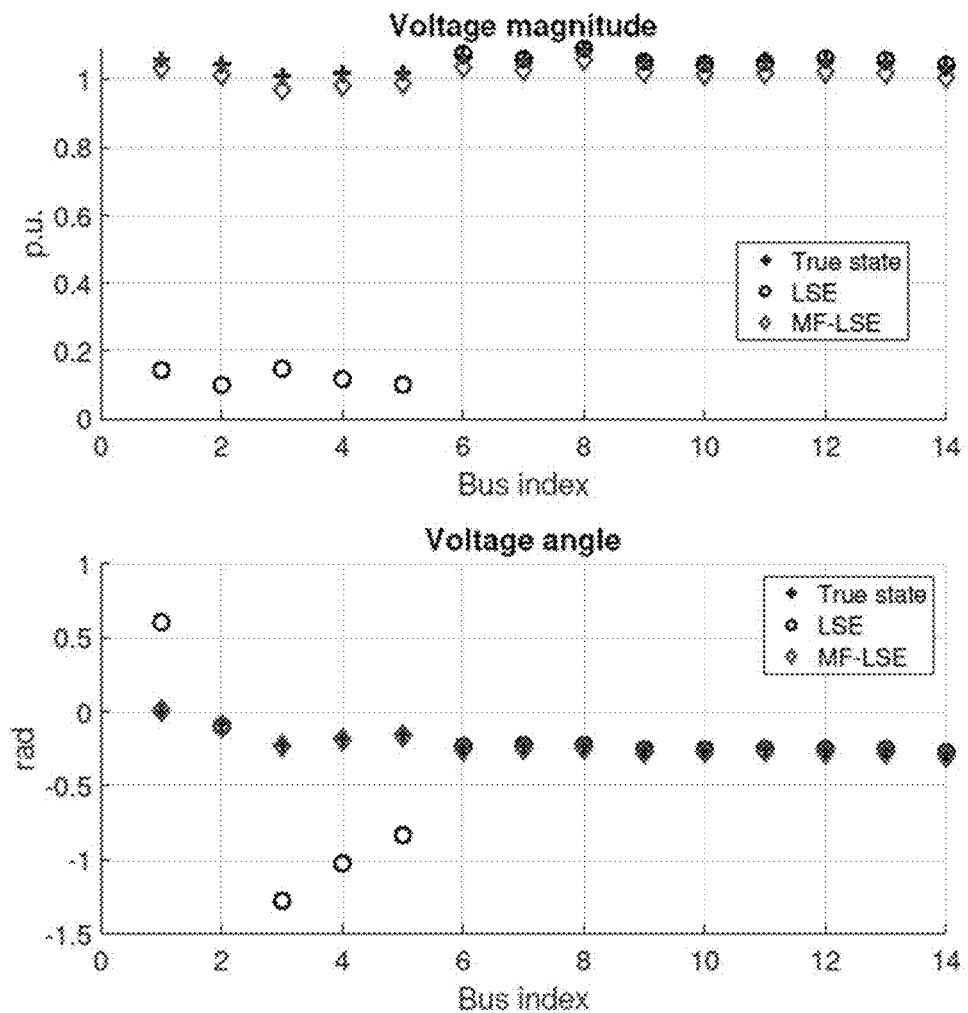

FIG. 10 compares the actual state to the estimated states by LSE and MF-LSE under a bad data scenario that a three-phase bad data is injected on the first 5 PMUs simultaneously. The from-end buses that the PMUs are located at are buses 1 and 2. Initially, all the corrupted measurements are not critical, but after several rounds of bad data removal, bus 1-5 are isolated from the rest of the system in terms of observability. The remained corrupted measurements become critical measurements that can not be identified and removed by LSE due to their low residuals. Hence, the quality of the estimation solution on bus 1-5 are compromised. On the contrary, the proposed machine learning-based filter, not affected by whether a measurement is critical or not, therefore can recover the bad data measurement and make fewer measurements removed, whose estimation accuracy is improved. The number of iterations in LSE bad data identification and removal is reduced as well.

Figure 11:
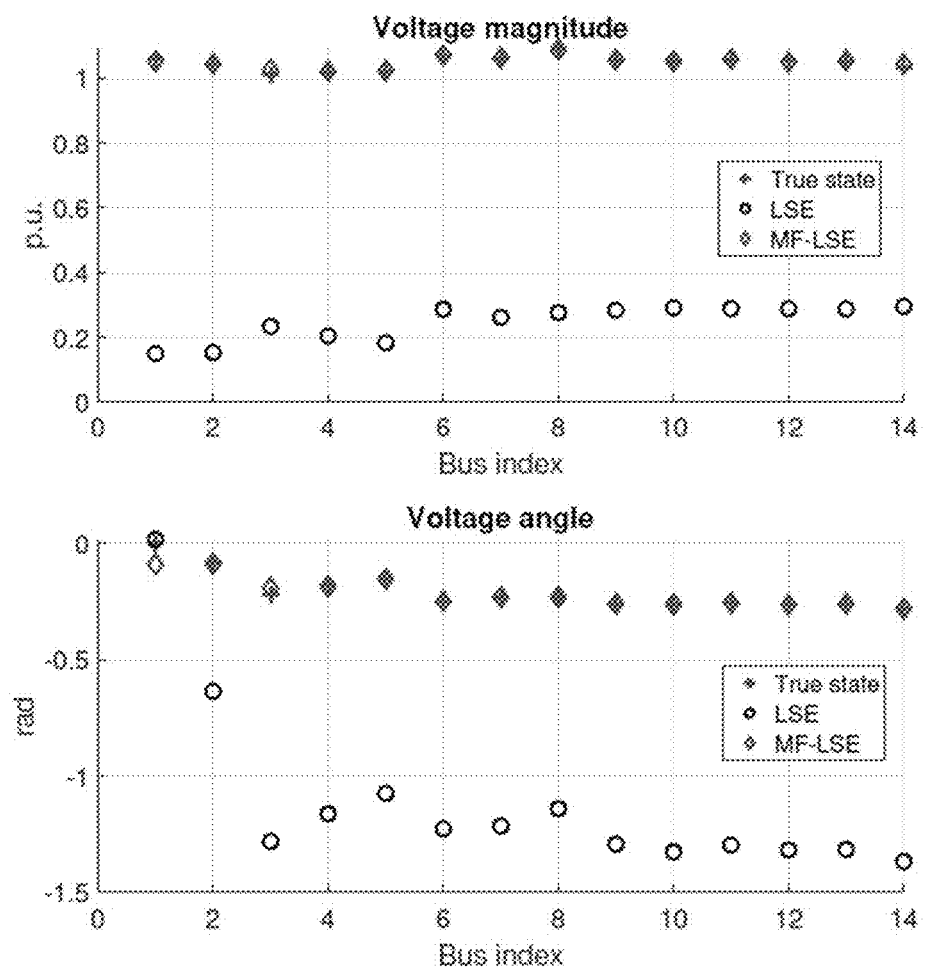

FIG. 11 shows the estimation results under a homogeneously interacting bad data scenario, in which the bad data is injected into the PMUs on lines 3, 4, 11, 12, 13 and 14. The from-end buses that the PMUs are located at are buses 2, 6 and 7. Due to the high penetration of bad data in the area of bus 6, the normal measurements related to it are removed improperly by LSE. Such kind of false-removal is further propagated through out the entire system until only the critical measurements are left. Hence, the LSE estimation on all 14 buses becomes inaccurate. The MF-LSE yields a higher estimation accuracy under this scenario because its filtering capability is not affected by multiple homogeneously interacting bad data and can protect the normal measurements from false-removal by reducing the severity of bad data before being removed by the LSE.

3.2.4 Sensitivity to Loading Conditions

Figure 12:
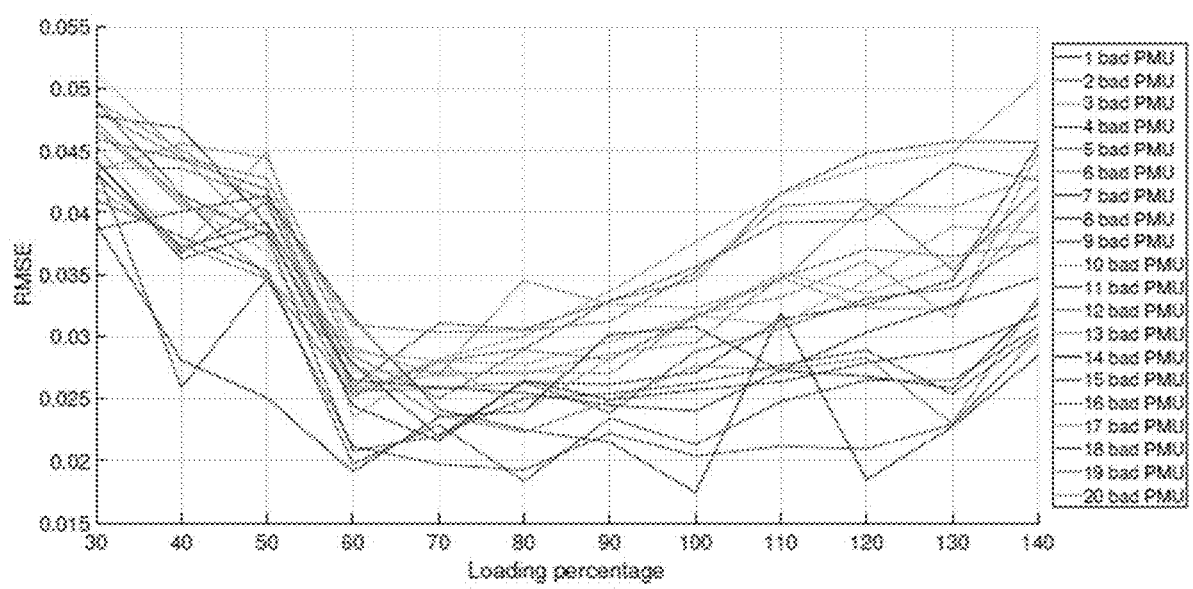

The filtering performance under different loading conditions are tested to show the robustness of the proposed filter against loading uncertainties. FIG. 12 shows the sensitivity of estimation accuracy to loading conditions from 30% to 140%, whereas the training data set is generated within the range of 60% to 100% loading conditions. Each curve corresponds to a bad PMU number, and each data point on the curve is the average estimation error of 100 randomly generated bad data scenarios. The curved are approximately in a "U" shape with the nadir in the range of 60% to 100%. This is because the loading conditions in this range are in the same bin with training data, therefore the accuracy is low, but the performance of ML methods on out-of-the-bin scenarios cannot be guaranteed. The estimation error of LSE using the filtered data under out-of-the-bin scenarios are still hold below 0.05 for the majority cases, which is acceptable for LSE. Hence, the proposed filter is robust under unexpected loading conditions.

3.2.5 Robustness Against Topology Inaccuracy

Topology change is another challenge in power system state estimation. Although topology information is usually assumed known from event detectors in related studies, it might be updated not in time or contains minor errors. Hence, the robustness of data-driven PMU data filtering under inaccurate topology is important. In this study, we consider all 20 N-1 loss of line scenarios in the IEEE 14-bus system to exam the robustness of the proposed filter against topology uncertainties.

Table 4 and Table 5 show the average estimation error and standard deviation of LSE and MF-LSE under the 20 loss-of-a-line scenarios. The average estimation error of the proposed MF-LSE method is lower than LSE in almost every scenario, except for when line 1 is tripped. In terms of numerical stability, MF-LSE yields a lower standard deviation of estimation error than LSE in all scenarios. Hence, it can be concluded that with the aid of the proposed machine learning-based filter, the robustness of LSE against topology inaccuracy is enhanced.

TABLE 4

Estimation error under N-1 scenarios

| Line index | MF-LSE | LSE |
|---|---|---|
| 1 | 0.1083 | 0.0439 |
| 2 | 0.0334 | 0.0481 |
| 3 | 0.05758 | 0.0715 |
| 4 | 0.0440 | 0.0711 |
| 5 | 0.0299 | 0.0709 |
| 6 | 0.0308 | 0.0713 |
| 7 | 0.03906 | 0.0714 |
| 8 | 0.0383 | 0.0785 |
| 9 | 0.0235 | 0.0712 |
| 10 | 0.0422 | 0.0717 |
| 11 | 0.0211 | 0.0720 |
| 12 | 0.0304 | 0.0738 |
| 13 | 0.0351 | 0.0725 |
| 14 | 0.0429 | 0.0789 |
| 15 | 0.0340 | 0.0773 |
| 16 | 0.0347 | 0.0735 |
| 17 | 0.0279 | 0.0818 |
| 18 | 0.0256 | 0.0737 |
| 19 | 0.0291 | 0.0715 |
| 20 | 0.0322 | 0.0715 |

TABLE 5

Standard deviation of estimation error under N-1 scenarios

| Line index | MF-LSE | LSE |
|---|---|---|
| 1 | 0.0073 | 0.018547 |
| 2 | 0.0064 | 0.01919 |

TABLE 5-continued

Standard deviation of estimation error under N-1 scenarios

| Line index | MF-LSE | LSE |
|---|---|---|
| 3 | 0.0045 | 0.022011 |
| 4 | 0.0059 | 0.021679 |
| 5 | 0.0054 | 0.021924 |
| 6 | 0.0053 | 0.021801 |
| 7 | 0.0068 | 0.021915 |
| 8 | 0.0041 | 0.039112 |
| 9 | 0.0039 | 0.021702 |
| 10 | 0.0063 | 0.021494 |
| 11 | 0.0041 | 0.0219 |
| 12 | 0.0045 | 0.0221 |
| 13 | 0.0039 | 0.0223 |
| 14 | 0.0034 | 0.0218 |
| 15 | 0.0042 | 0.0369 |
| 16 | 0.0039 | 0.0222 |
| 17 | 0.0025 | 0.0215 |
| 18 | 0.0041 | 0.0219 |
| 19 | 0.0050 | 0.0219 |
| 20 | 0.0040 | 0.0220 |

3.3 Results on a Real-World System with Real PMU Data

Figure 13:

An embodiment of the present disclosure has been applied to a practical provincial power grid—the Jiangsu power grid in China. The Jiangsu power grid, as shown in FIG. 13, has 731 substations and power plants, where 244 of the substations and power plants have 1138 PMU installed. There are 2335 buses and 2393 transmission lines in the nodal-breaker model of this power grid. PMU measurements collected in the Jiangsu system are from Mar. 1st to 15th in 2019 with a reporting rate of 25 Hz. 80% of the data sets are used for training while the remaining 20% are used for testing. In practice, the true value of a PMU measurement is generally unknown. Therefore, the solutions of a linear state estimation with bad data identification and removal are used as the labels for both the training and testing data. The proposed bad data filtering approach is used as the PMU data pre-processing and followed by a linear state estimator.

A triple-circuit transmission line 00JDMB-0DS1X is used as an illustrative example. The three circuits are labeled as line I, II, and III, respectively. The objective of this test case is to identify and recover the bad data on line I using the proposed machine learning-based filter. In order to show the effectiveness of the proposed approach, a following linear state estimator is not included in this example.

Figure 14:
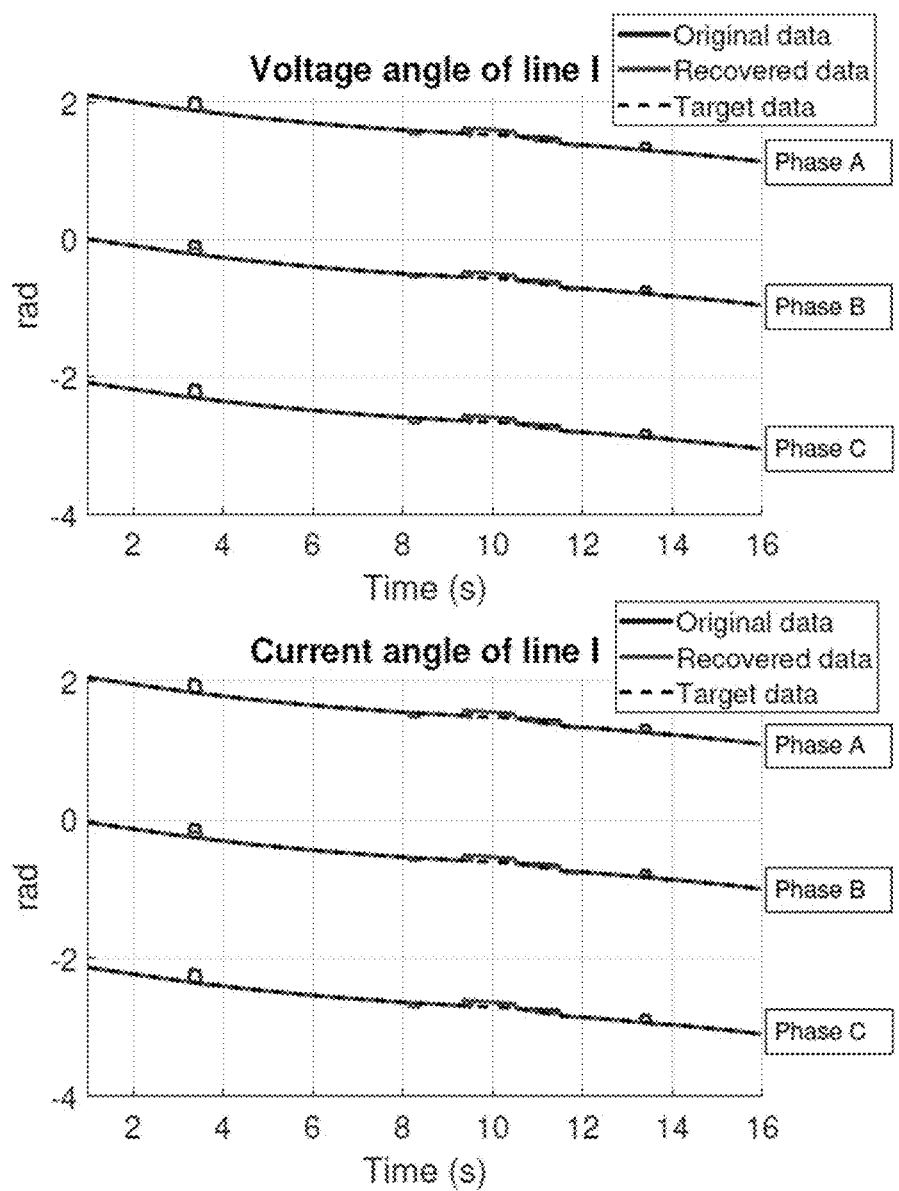

FIG. 14 shows the comparison among the original, recovered, and target data streams of line I during the period from 2019-03-01 16:26:04 to 16:26:20. By leveraging the proposed approach, most of the bad data can be well identified and recovered—specially the shorter-lasted bad data periods around the 80th and 340th steps. It can reduce the bad data processing burden on the LSE segment.

Table 6 summarizes the bad data identification results and the evaluation metrics are listed in Table 7. All identification metrics are above 80%, among which the precision is over 90%, indicating a high identification performance. The RMSE of the recovered data is extremely low, indicating a high recovery fidelity.

TABLE 6

Classification results summary of line I in the practical case

| | Label | |
|---|---|---|
| Prediction | Bad data | Good data |
| Bad data | 83 | 6 |
| Good data | 16 | 295 |

TABLE 7

Identification accuracy of current angle of line I in the practical case

| Item | Score |
|---|---|
| Precision | 93.26% |
| Recall | 83.84% |
| F1 | 88.30% |
| RMSE | 0.0045 |

Table 8 compares the performance of various approaches. MF refers to the proposed machine learning filter (KNN/DA). MF-LSE refers to applying the proposed machine learning filter to a linear state estimator with bad data identification and removal. LSE refers to a linear state estimator with bad data identification and removal with a time limit, beyond which the iteration stops. LSE* refers to linear state estimation with unlimited time to perform bad data identification and removal. The evaluation metrics are listed in the left column. The "Max Residual" is the maximum normalized residual obtained in the final iteration of the LSE. For all approaches, we assume a maximum 200 ms time limit for finishing the computation of each snapshot (except for LSE*), which requires generating an LSE solution five times per second. From Table 8, it is observed that the proposed filter with an LSE gives the highest F1 score, which indicates an overall good performance over precision and recall. The LSE only approach gets a very high precision because it is unlikely to label good data as bad ones. However, due to its iterative structure that an extra round of iteration needed to remove a bad measurement, it can only process a limited number of bad data within 200 ms so that the recall is much lower than using the proposed approach as a data preprocessor. If enough time is given, the linear state estimation will be able to identify most of the bad data and generates a very high F1 score, as is suggested by the LSE* column. Overall, the proposed approach plus an LSE following it gives the highest F1 score in practical systems. If only the proposed approach is used without an LSE following it, the recall score will be compromised.

TABLE 8

Performance comparison of various approaches

| Item | MF | MF-LSE | LSE | LSE* |
|---|---|---|---|---|
| Precision | 0.931 | 0.9417 | 1 | 1 |
| Recall | 0.8265 | 0.9898 | 0.1719 | 1 |
| F1 | 0.8757 | 0.9652 | 0.2933 | 1 |
| Max. Res. | 0 | 2.9422 | 6.7511 | 2.9312 |

Table 9 demonstrates the average computation time for each snapshot given the number of bad data specified in the leftmost column. The row header has the same definition as Table 8. If there is few bad data encountered, the LSE approach gives the fastest performance to obtain a reasonable state estimation solution. As the number of bad data increases, the time consumption for LSE to process all the bad data grows much faster than the proposed method. If only using the proposed data filter without linear state estimation, it gives the best computation speed, but the F1 score will be compromised, as is shown in Table 8. Therefore, a good trade-off between the computation time and solution quality is to use the proposed machine learning filter as a data pre-processor followed by a linear state estimator to calculate the states and process any bad data which is not identified by the proposed approach.

TABLE 9

Average computation time (ms) for processing bad data

| Bad Data # | MF | MF-LSE | LSE |
|---|---|---|---|
| 0 | 6.7209 | 13.6849 | 6.9615 |
| 1 | 7.1674 | 14.1444 | 7.4473 |
| 10 | 7.4171 | 30.879 | 79.472 |
| 50 | 12.8356 | 98.5046 | 388.1276 |

Publications cited throughout this document are hereby incorporated by reference in their entirety. While one or more embodiments of the present disclosure have been described, it is understood that these embodiments are illustrative only, and not restrictive, and that many modifications may become apparent to those of ordinary skill in the art, including that various embodiments of the inventive methodologies, the illustrative systems and platforms, and the illustrative devices described herein can be utilized in any combination with each other. Further still, the various steps may be carried out in any desired order (and any desired steps may be added and/or any desired steps may be eliminated).

What is claimed is:

1. A method for processing measurement data in an electric power system, the method comprising:
   acquiring the measurement data from the electric power system; and
   inputting a plurality of the measurement data within a predetermined time window into a machine learning module for identifying bad data among the plurality of the measurement data, the plurality of the measurement data being vector data acquired by a plurality of phasor measurement unit (PMU) coupled to a plurality of lines of the electric power system, wherein
   when one of the plurality of measurement data contains a bad datum, the machine learning module sends the bad datum to a denoising autoencoder module for correcting the bad datum, wherein the denoising autoencoder outputs a corrected part corresponding to the bad datum; and
   when one of the plurality of measurement data contains no bad datum, the machine learning module bypasses the denoising autoencoder module and outputs the one of the plurality of measurement data as an untouched part,
   wherein the denoising autoencoder module includes a magnitude recovery denoising autoencoder and an angle recovery denoising autoencoder, wherein when the bad datum contains only a bad magnitude, the bad datum is only sent to the magnitude recovery denoising autoencoder for the correction;
   when the bad datum contains only bad angle, the bad datum is only sent to the angle recovery denoising autoencoder for the correction; and
   when the bad datum contains both bad magnitude and bad angle, the bad datum is sent to both the magnitude recovery denoising autoencoder and the angle recovery denoising autoencoder for the correction.

2. The method of claim 1, wherein the plurality of the measurement data are arranged in a matrix with vector data arranged in columns.

3. The method of claim 1, wherein the predetermined time window slides over time for inputting measurement data at different time.

4. The method of claim 1, wherein the machine learning module includes a K-nearest neighbor (KNN) algorithm.

5. The method of claim 4, wherein the machine learning module identifies a bad datum by weighted majority vote of a predetermined number of nearest data in terms of Euclidean distance.

6. The method of claim 1, wherein the denoising autoencoder module includes a denoising autoencoder with symmetrical layers of neural network that are trained to reproduce input data at an output thereof.

7. The method of claim 1 further comprising combining the untouched part with the corrected part to form a recovered data stream.

8. The method of claim 1, wherein the measurement data received by the machine learning module are always from a predetermined PMU.

9. The method of claim 1, wherein the measurement data received by the machine learning module are from a first PMU at a first time and a second PMU at a second time different from the first time via a data bus.

10. A system for processing measurement data in an electric power system, the system comprising:
   measurement devices including a plurality of phasor measurement unit (PMU) coupled to lines of the electric power system for measuring state information at the lines;
   a processor; and
   a computer-readable storage medium, comprising:
   software instructions executable on the processor to perform operations, including:
   acquiring the measurement data from the measurement devices; and
   inputting a plurality of the measurement data within a predetermined time window into a machine learning module for identifying bad data among the plurality of the measurement data, wherein
   when one of the plurality of measurement data contains a bad datum, the machine learning module sends the bad datum to a denoising autoencoder module for correcting the bad datum, wherein the denoising autoencoder module outputs a corrected part corresponding to the bad datum; and
   when one of the plurality of measurement data contains no bad datum, the machine learning module bypasses the denoising autoencoder module and outputs the one of the plurality of measurement data as an untouched part,
   wherein the denoising autoencoder module includes a magnitude recovery denoising autoencoder and an angle recovery denoising autoencoder, wherein when the bad datum contains only a bad magnitude, the bad datum is only sent to the magnitude recovery denoising autoencoder for the correction;
   when the bad datum contains only bad angle, the bad datum is only sent to the angle recovery denoising autoencoder for the correction; and
   when the bad datum contains both bad magnitude and bad angle, the bad datum is sent to both the magnitude recovery denoising autoencoder and the angle recovery denoising autoencoder for the correction.

11. The system of claim 10, wherein the predetermined time window slides over time for inputting measurement data at different time.

12. The system of claim 10, wherein the machine learning module includes a K-nearest neighbor (KNN) algorithm.

13. The system of claim 10, wherein the measurement data received by the machine learning module are always from a predetermined PMU.

14. The system of claim 10, wherein the measurement data received by the machine learning module are from a first PMU at a first time and a second PMU at a second time different from the first time via a data bus.

15. A method for processing measurement data in an electric power system, the method comprising:
- acquiring the measurement data by a phasor measurement unit (PMU) coupled to a line of the electric power system; and
- inputting a plurality of the measurement data within a predetermined time window into a K-nearest neighbor (KNN) for identifying bad data among the plurality of the measurement data, wherein
- when one of the plurality of measurement data contains a bad datum, the machine learning module sends the bad datum to a denoising autoencoder module for correcting the bad datum, wherein the denoising autoencoder outputs a corrected part corresponding to the bad datum; and
- when one of the plurality of measurement data contains no bad datum, the machine learning module bypasses the denoising autoencoder module and outputs the one of the plurality of measurement data as an untouched part,
- wherein the denoising autoencoder module includes a magnitude recovery denoising autoencoder and an angle recovery denoising autoencoder, wherein when the bad datum contains only a bad magnitude, the bad datum is only sent to the magnitude recovery denoising autoencoder for the correction;
- when the bad datum contains only bad angle, the bad datum is only sent to the angle recovery denoising autoencoder for the correction; and
- when the bad datum contains both bad magnitude and bad angle, the bad datum is sent to both the magnitude recovery denoising autoencoder and the angle recovery denoising autoencoder for the correction.

16. The method of claim 15 further comprising combining the untouched part with the corrected part to form a recovered data stream.

\* \* \* \* \*